United States Patent
Arai

(10) Patent No.: US 8,404,044 B2
(45) Date of Patent: Mar. 26, 2013

(54) EPITAXIAL GROWTH FILM FORMATION METHOD

(75) Inventor: Hideki Arai, Shizuoka (JP)

(73) Assignee: NuFlare Technology, Inc., Shizuoka (JP)

(*) Notice: Subject to any disclaimer, the term of this patent is extended or adjusted under 35 U.S.C. 154(b) by 1217 days.

(21) Appl. No.: 12/237,499

(22) Filed: Sep. 25, 2008

(65) Prior Publication Data

US 2009/0087560 A1 Apr. 2, 2009

(30) Foreign Application Priority Data

Sep. 27, 2007 (JP) ................................. 2007-252062

(51) Int. Cl.
*C30B 23/00* (2006.01)
*C30B 25/00* (2006.01)
*C30B 28/12* (2006.01)
*C30B 28/14* (2006.01)
*C30B 35/00* (2006.01)

(52) U.S. Cl. ............. 117/84; 117/88; 117/109; 117/200
(58) Field of Classification Search .................. 117/84, 117/88, 109, 200
See application file for complete search history.

(56) References Cited

U.S. PATENT DOCUMENTS

| | | | |
|---|---|---|---|
| 8,021,968 B2 * | 9/2011 | Nishizawa et al. | 438/503 |
| 2007/0227441 A1 * | 10/2007 | Narahara et al. | 117/84 |
| 2009/0139448 A1 * | 6/2009 | Hirata et al. | 117/107 |

FOREIGN PATENT DOCUMENTS

JP 2004-327761 * 11/2004

* cited by examiner

*Primary Examiner* — James McDonough
(74) *Attorney, Agent, or Firm* — Finnegan, Henderson, Farabow, Garrett & Dunner, L.L.P.

(57) ABSTRACT

An epitaxial growth film formation method allowing to adequately prevent the sticking phenomenon spreading over both a wafer and a susceptor when a horizontal disc-like susceptor is used to form an epitaxial growth film is provided. The epitaxial growth film formation method is a method of forming a vapor growth film on the wafer by placing the wafer having a diameter smaller than that of the susceptor approximately horizontally in substantially a center section on the horizontal disc-like susceptor, wherein the vapor growth film is formed on the wafer by bringing a circumferential recess step adjacent to a bottom inside from an edge part of the wafer and a convex step provided on a circumference of an upper surface inside from the edge part of the susceptor into contact.

9 Claims, 3 Drawing Sheets

EPITAXIAL GROWTH FILM FORMATION METHOD

CROSS-REFERENCE TO RELATED APPLICATION

This application is based upon and claims the benefit of priority from Japanese Patent Applications No. 2007-252062, filed on Sep. 27, 2007; the entire contents of which are incorporated herein by reference.

FIELD OF THE INVENTION

The present invention relates to an epitaxial growth film formation method, and in particular, relates to a film formation method capable of preventing a sticking phenomenon of a wafer and a susceptor due to a growth film, which causes a problem when an epitaxial growth film should be efficiently formed.

BACKGROUND OF THE INVENTION

A single wafer epitaxial growth apparatus is known as a type of epitaxial growth apparatus. This apparatus forms an epitaxial film on the upper surface of a wafer by putting the wafer on a horizontal disc-like susceptor arranged in a horizontal heating furnace and allowing a material gas to circulate in a horizontal direction inside the furnace while rotating the wafer around a vertical axis. This apparatus is more frequently used with an increasing diameter of wafers and is considered to be mainstream in a 300 mm wafer compliant apparatus.

The single wafer epitaxial growth apparatus has a circular recess for placing a wafer provided on the upper surface of the horizontal disc-like susceptor for the purpose of bringing a material gas into contact with only the upper surface of a wafer on which an epitaxial growth film is formed. By allowing epitaxial growth by placing a wafer in the recess called counter boring, the sticking phenomenon of the wafer and the susceptor due to a growth film is suppressed.

The use of wafer using epitaxial growth includes power devices such as IGBT (Insulated Gate Bipolar Transistor) In the manufacture of epitaxial wafers for power devices, epitaxial growth films are thick, exceeding sometimes 100 μm or so. When such a thick film is formed, even if a wafer on the susceptor is contained in a recess, a sticking phenomenon of an inner circumferential surface of the susceptor and an outer circumferential surface of the wafer by a growth film spreading over both tends to occur. If this phenomenon occurs, a growth film of a sticking portion must be peeled off when the wafer is taken out from the susceptor after epitaxial growth. At this point, a considerable force is applied to an outer circumferential portion of the wafer and thus, cracks often appear in the wafer, leading sometimes to splitting.

A technology to provide a step in an inner circumferential portion on the upper surface of the susceptor recess as countermeasures to prevent the sticking phenomenon of a wafer and a horizontal disc-like susceptor is disclosed by JP-A 2004-327761 (KOKAI). According to this technology, the position of a wafer can be controlled to a center section of the susceptor recess so that an edge part of the wafer and the inner circumferential portion of the susceptor do not come into contact.

Basically one recess is provided on the upper surface of a horizontal disc-like susceptor in a single wafer epitaxial growth apparatus. On the other hand, a plurality of wafers can simultaneously be processed by arranging a large-diameter horizontal disc-like susceptor in a large horizontal heating furnace and providing a plurality of recesses around the rotation center of the upper surface thereof.

SUMMARY OF THE INVENTION

However, when the technology disclosed by JP-A 2004-327761 (KOKAI) is used, a wafer slides in the radial direction in a recess of a horizontal disc-like susceptor to bring the outer circumferential surface of the wafer locally into contact with the inner circumferential surface of the recess so that wafer sticking is more likely to occur in a contact portion. The slide of a wafer occurs when the wafer is automatically brought into the recess of the susceptor. In addition, according to a technology by which a plurality of wafers is simultaneously processed by arranging the above large-diameter horizontal disc-like susceptor in the large horizontal heating furnace and providing a plurality of recesses around the rotation center of the upper surface thereof, a centrifugal force acts on the wafers in the recesses of the susceptor and thus, the wafers slide in the radial direction also during operation, making sticking by local contact more likely. Therefore, there is a problem that local contact between the outer circumferential surface of the wafer and the inner circumferential surface of the susceptor cannot be adequately prevented by the technology shown in JP-A 2004-327761 (KOKAI) by which a step is provided on the upper surface of the susceptor recess and the sticking phenomenon of a wafer and a susceptor cannot be adequately prevented.

Embodiments of the present invention have been developed in view of the above subject and an object thereof is to provide an epitaxial growth film formation method capable of adequately preventing the sticking phenomenon of a wafer and a susceptor when an epitaxial growth film is formed by using a horizontal disc-like susceptor.

To achieve the above object by tackling the subject, the epitaxial growth film formation method in embodiments of the present invention is constituted as shown below.

An epitaxial growth film formation method in an aspect of the present invention is a method of forming a vapor growth film on a wafer by placing the wafer having a diameter smaller than that of a susceptor approximately horizontally in substantially a center section on the horizontal disc-like susceptor, wherein the vapor growth film is formed on the wafer by bringing a circumferential recess step adjacent to a bottom inside from an edge part of the wafer and a convex step provided on a circumference of an upper surface inside from the edge part of the susceptor into contact.

With a configuration to bring the convex step provided on the upper surface of a horizontal disc-like susceptor and the recess step adjacent to the wafer bottom into contact, a effect of adequately preventing the sticking phenomenon formed spreading over both the wafer and susceptor is achieved when the horizontal disc-like susceptor is used to form an epitaxial growth film.

DETAILED DESCRIPTION OF THE EMBODIMENTS

An embodiment of an epitaxial growth film formation method according to the present invention will be described below based on appended drawings.

Figure 1:
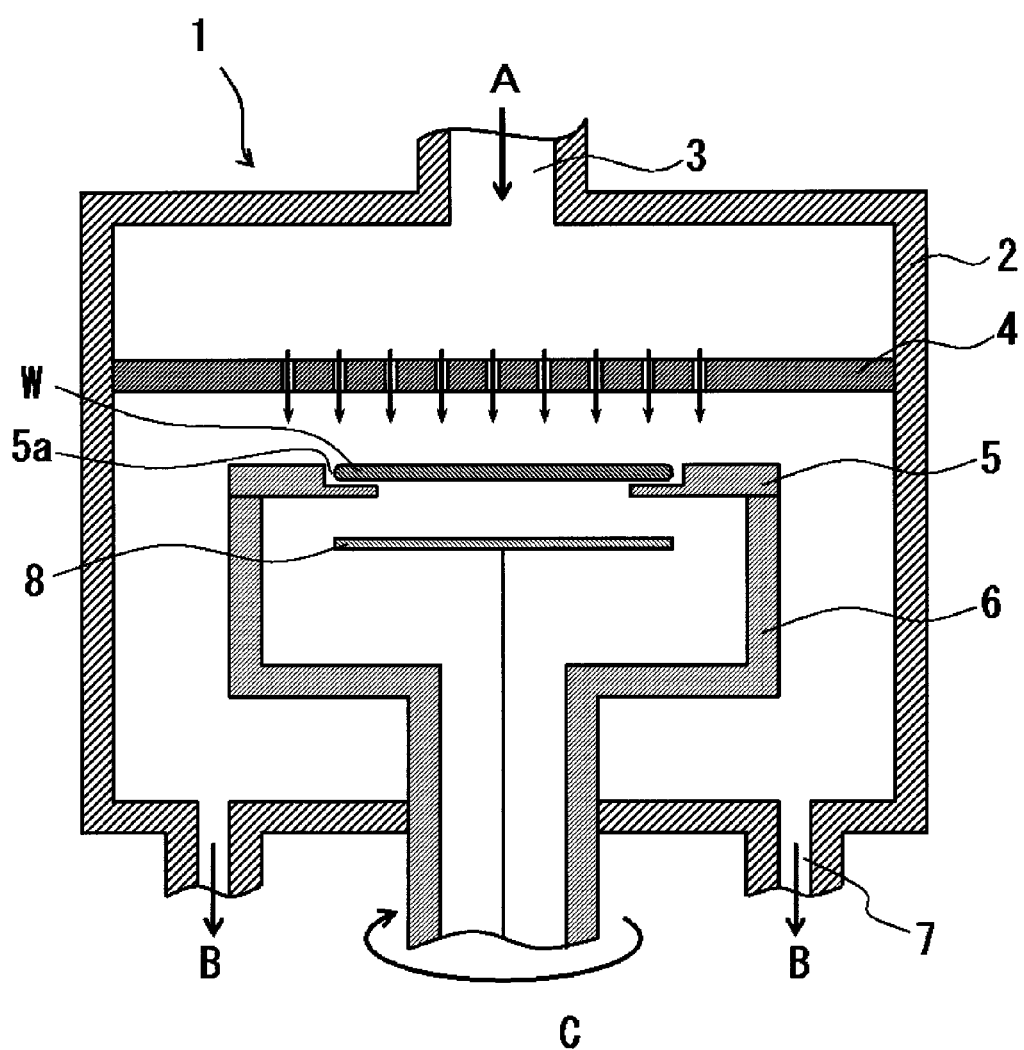
FIG. 1 is a schematic diagram of a film formation apparatus used for an epitaxial growth film formation method in an embodiment.

FIG. 1 is a schematic diagram of a film formation apparatus used for the epitaxial growth film formation method in the present embodiment. A film formation apparatus 1 is an apparatus for forming a vapor growth film on a wafer W and includes a chamber 2, a gas feed pipe 3, a straightening vane 4, a susceptor 5, a susceptor recess 5a, a rotating barrel 6, a gas exhaust pipe 7, and a heater 8.

The gas feed pipe 3 is disposed in an upper part inside the chamber 2 substantially in a center section in the horizontal direction and the chamber 2 is connected to a gas feed control device (not shown) so that a material gas or a carrier gas is fed into the chamber 2. In accordance with the type of thin film formed in the film formation apparatus 1, a material gas, for example, $SiHCl_3$ or the like for a thick film or a carrier gas, for example, $H_2$ or the like is fed from the gas feed control device (not shown) in an arrow A direction in FIG. 1.

The gas exhaust pipe 7 is disposed in a lower part inside the chamber 2 at two locations on the right and left sides in FIG. 1 and the chamber 2 is connected to an outer gas exhaust control device (not shown) so that a gas after being used for vapor growth inside the chamber 2 is discharged out of the chamber 2. With the chamber 2 connected to the gas exhaust control device (not shown), a gas discharged in an arrow B direction in FIG. 1 is disposed of as an exhaust gas.

Further, the chamber 2 has the straightening vane 4, the susceptor 5, the rotating barrel 6, and the heater 8 therewithin.

The straightening vane 4 is used to adjust the flow rate of material gas flowing from the gas feed pipe 3 and may be formed from quarts, stainless or the like. The straightening vane 4 is fixed to both sides inside the chamber 2 in a space between the gas feed pipe 3 and the susceptor 5. The straightening vane 4 may also has many openings provided throughout a range opposite to the wafer W. The area of openings is adjusted so that the flow rate of gas becomes uniform throughout the wafer W.

The rotating barrel 6 is a rotator for rotating the susceptor 5 and has a drive function to generate high-speed rotation of the susceptor 5 at fixed rotation speed in an arrow C direction in FIG. 1. The rotation speed is preferably 500 rpm or more to efficiently form a highly uniform film by applying the film formation method in the present embodiment.

The heater 8 is a heating device to heat the wafer W fixed on the susceptor 5 from a rear side to a predetermined temperature, for example, 1100° C. or so. The wafer W is heated to the predetermined temperature by a constant current fed from a heat circuit (not shown) provided outside the chamber 2.

The susceptor 5 supports the wafer W for generating a thin film by vapor growth and has a function to fix the wafer W at a predetermined position. Because the susceptor 5 holds the wafer W, the susceptor 5 is also called a holder. Further, the rotating barrel 6 supports the susceptor 5. The susceptor 5 has a recess 5a provided therein and the wafer W is held by adjusting to the position of the recess 5a.

Figure 2:
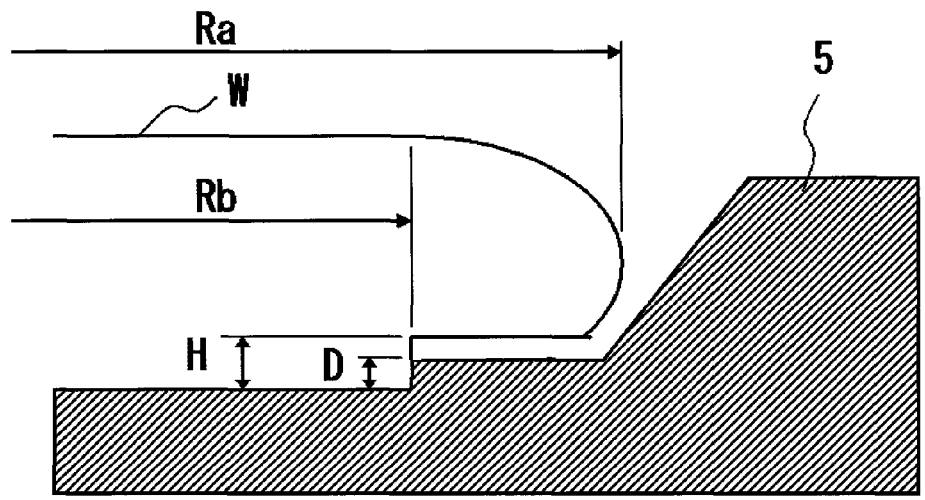
FIG. 2 is an enlarged sectional view showing a holding state of a wafer W on a susceptor in the embodiment.

The holding state of the wafer W on the susceptor 5 when a vapor growth film is formed will be described in detail below with reference to enlarged views. FIG. 2 is an enlarged sectional view showing the holding state of the wafer W on the susceptor 5 according to the present embodiment. In FIG. 2, the height of a circumferential recess step provided adjacent to the bottom of the wafer W is H and the height of a convex step provided on a circumference of the upper surface inside from an edge part of the susceptor 5 is D.

If the height H of the recess step adjacent to the bottom of the wafer W is lower than the height D of the convex step of the susceptor 5, the wafer W is supported on the susceptor 5 only by the edge part and thus the wafer W is more likely to be damaged. Because the contact area of the edge part also increases, a problem of a sticking portion, which is more likely to occur, arises due to a film formed spreading over both the wafer W and the susceptor 5. Therefore, the height H of the recess step of the wafer W is preferably higher than the height D of the convex step of the susceptor 5.

If, on the other hand, the height H of the recess step of the wafer W is too high, the wafer thickness of outer part becomes thinner, making a strengthen of the wafer lower and may cause wafer crack or slip. Therefore, the appropriate range of the height H of the recess step of the wafer W is 20 μm or more and about 30% of thickness of the center section of the wafer W. Also, if the height H of the recess step of the wafer W is too high, the space between the wafer W and the susceptor 5 broadens, causing a problem of a sticking portion, which is more likely to occur, in the edge part of the wafer W due to a material gas circulating around the space. Thus, the height H of the recess step of the wafer W should be equal to the height D of the convex step of the susceptor 5 or preferably slightly higher.

Similarly, for a reason of being preferable from the viewpoint of preventing the sticking phenomenon when the space around which a material gas circulates is as small as possible, a diameter Rb of the recess step adjacent to the bottom of the wafer W is preferably substantially equal to the diameter of a boundary portion between the upper surface of the wafer W and an arc-shaped bevel surface (inclined plane) and the diameter Rb is preferably about 99.6% of an outer circumferential diameter Ra of the wafer W.

Figure 3:
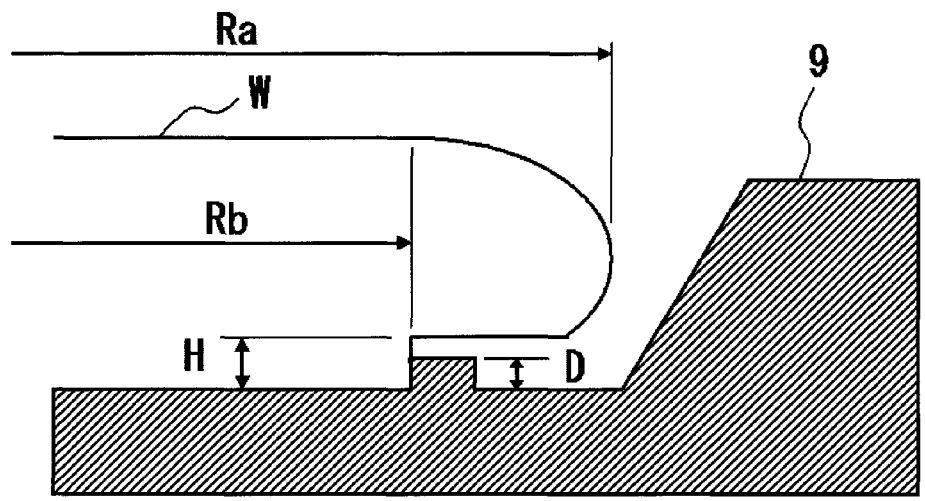
FIG. 3 is an enlarged sectional view showing of a modification the holding state of the wafer W on the susceptor in the embodiment.

FIG. 3 is an enlarged sectional view showing a modification of the holding state of the wafer W on the susceptor 5 according to the present embodiment. FIG. 3 shows a susceptor 9, which has a different shape from that of the susceptor 5. The susceptor 9 has a configuration in which a protruding part of a height D is provided.

An important point of the epitaxial growth film formation method according to the present embodiment is that the shape of the circumferential recess step adjacent to the bottom of the wafer W and that of the convex step provided on the upper surface of the susceptor 5 have a configuration to prevent a horizontal shift of the wafer W on the susceptor 5 by being in contact, as described above, and the present invention is not limited to the configuration described in the present embodiment.

Figure 4:
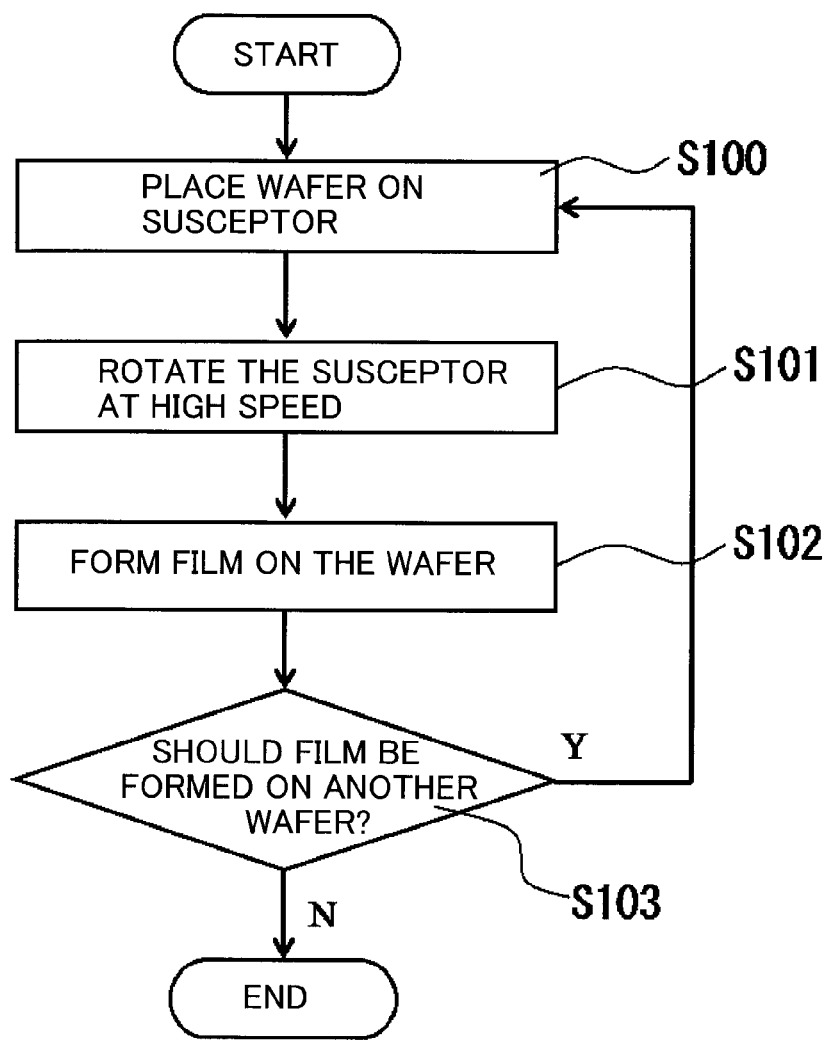
FIG. 4 is a flow chart showing a film formation procedure of the epitaxial growth film formation method in the embodiment.

A film formation procedure of the epitaxial growth film formation method according to the present embodiment will be described in detail. FIG. 4 is a flow chart showing the film formation procedure of the epitaxial growth film formation method according to the present embodiment. The film formation procedure will be described following FIG. 4.

First, the wafer W is placed on the susceptor 5 (step S100). The susceptor 5 is rotated at high speed (step S101). A vapor growth film is formed on the wafer W (step S102). To form a vapor growth film on another wafer (step S103: Yes), return to step S100. If, on the other hand, no vapor growth film is formed on another wafer (step S103: No), the operation is terminated.

According to the film formation method according to the present embodiment, as described above, by adopting a configuration in which a circumferential recess step adjacent to the bottom of the wafer W and a convex step provided on the circumference of the upper surface of the susceptor 5 are brought into contact, the wafer W does not shift horizontally even if the susceptor 5 holding the wafer W on which a vapor growth film is formed is rotated at high speed. The amount of a circulating material gas contributing to epitaxial growth is smaller on the rear side than on the side of the wafer. Therefore, the amount of growth of an epitaxial growth film is small on the rear side of the wafer. Thus, by adopting a configuration in which the rear side of the wafer with less epitaxial growth is brought into contact with the susceptor and both sides of the wafer are not in contact at all with the susceptor, connection of a polycrystal film growing from the susceptor and an epitaxial growth film growing on the wafer can be avoided. Thus, an occurrence of the sticking phenomenon spreading over the wafer W and the susceptor 5 is prevented and the wafer W is not damaged when the wafer W is taken out from the susceptor 5.

In the present embodiment, details of the convex step provided on the upper surface of the susceptor 5 have been given by illustrating the configuration in which the convex step is circumferentially provided, but the convex step may be formed as a plurality of protruding portions (for example, pins) arranged on a circumferential virtual line at equal intervals.

Further, according to the present embodiment, an outer circumferential guide is made unnecessary even when a wafer is washed at ordinary temperature so that the whole area can be washed without causing a local flow change of cleaning fluid by the guide. Moreover, because a wafer is just put, the wafer can be removed and placed swiftly.

In the present embodiment, the film formation apparatus 1 including the so-called substantially doughnut-shaped susceptor 5 having an opening in the center and the wafer W contained in the susceptor 5 is shown in FIG. 1. However, a susceptor in a so-called substantially saucer-shaped susceptor having no opening in the center will achieve a similar effect just like the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An epitaxial growth film formation method of forming a vapor growth film on a wafer by placing the wafer having a diameter smaller than that of a susceptor approximately horizontally in substantially a center section on the horizontal disc-like susceptor, wherein
    the vapor growth film is formed on the wafer by bringing into contact a circumferential recess step formed on a bottom surface of the wafer and a convex step formed on an upper surface of the susceptor, the circumferential recess step being provided at an edge part of the wafer, the convex step being provided on a circumference of the upper surface inside from an edge part of the susceptor, and the circumferential recess step is higher than the convex step.

2. The method according to claim 1, wherein a height of the circumferential recess step is 20 μm or more.

3. The method according to claim 1, wherein a height of the circumferential recess step is 30% or less of thickness of the center section of the wafer.

4. The method according to claim 1, wherein a diameter of the circumferential recess step is substantially equal to that of a boundary between an upper plane of the wafer and a bevel surface forming an arc shape.

5. The method according to claim 4, wherein the diameter of the circumferential recess step is about 99.6% of an outer circumferential diameter of the wafer W.

6. The method according to claim 1, wherein the convex step has a circumferential shape.

7. The method according to claim 1, wherein the convex step has a protruding shape.

8. The method according to claim 1, wherein the convex step has a circumferential shape.

9. The method according to claim 1, wherein the convex step has a protruding shape.

* * * * *